United States Patent
Iihoshi et al.

(10) Patent No.: US 6,271,692 B1
(45) Date of Patent: Aug. 7, 2001

(54) SEMICONDUCTOR INTEGRATED CIRCUIT (75) Inventors: Yoshio Iihoshi; Tsutomu Kato; Chika Takahashi, all of Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/493,144

(22) Filed: Jan. 28, 2000

(30) Foreign Application Priority Data

Mar. 17, 1999 (JP) .................................................. 11-072280

(51) Int. Cl.$^7$ ............................. H03K 5/22; H03K 5/153
(52) U.S. Cl. ............................. 327/81; 327/80; 327/309; 365/201
(58) Field of Search ................................... 327/306, 309, 327/320, 314, 534, 50, 81, 80; 365/201, 233

(56) References Cited

U.S. PATENT DOCUMENTS

| 5,525,933 | * | 6/1996 | Matsuki et al. | ........................ | 327/314 |
| 6,081,152 | * | 6/2000 | Maley | .................................. | 327/320 |

FOREIGN PATENT DOCUMENTS

| 5-199097 | 8/1993 | (JP) . |
| 7-240678 | 9/1995 | (JP) . |
| 8-125033 | 5/1996 | (JP) . |
| 8-222643 | 8/1996 | (JP) . |
| 8-288404 | 11/1996 | (JP) . |

* cited by examiner

Primary Examiner—Dinh T. Le
(74) Attorney, Agent, or Firm—Jones Volentine, PLLC (57) ABSTRACT

An internal circuit of a semiconductor integrated circuit includes an inverter inputted with an input signal and is supplied with a power supply voltage during normal operation. The input terminal and the internal circuit are connected by a signal line having a resistor. A voltage determining circuit for determining whether a voltage of an input signal inputted to the input terminal is a signal voltage for use in the normal operation of the internal circuit or a high voltage for setting up an internal circuit test mode is connected to a node of the signal line. P-type MOS transistors are connected in series across a node of the signal line and the power supply voltage. The source of a first one of the P-type MOS transistors is connected to the power supply voltage together with the gate electrode and the substrate, and the drain is connected to the drain of the other P-type MOS transistor. The source of the other P-type MOS transistor is connected to the signal line together with the gate electrode and the substrate, and the drain is connected to the drain of the first P-type MOS transistor. An N-type MOS transistor is connected across the node of the signal line and the earth potential, the source is connected to the node of the signal line, and the drain is connected to the earth voltage together with the gate electrode and the substrate.

19 Claims, 3 Drawing Sheets

SEMICONDUCTOR INTEGRATED CIRCUIT

BACKGROUND OF THE INVENTION

1. Field of the Invention

The present invention relates to enabling switching over from a normal operating mode to an internal circuit test mode by using an input terminal inputted with an input signal used during normal operation of the internal circuit within the semiconductor integrated circuit as a terminal for inputting a high-voltage (a voltage higher than the input signal voltage used during normal operation) test signal during testing (hereinafter referred to as internal circuit testing) such as reading and writing, for example, internal memory data prior to shipping the semiconductor integrated circuits as products. The present invention relates to a semiconductor integrated circuit equipped with a protection circuit having a superior protection function where this switching circuit is implemented without increasing the surface area of the semiconductor chip.

2. Description of the Related Art

Conventionally, in semiconductor integrated circuits that test internal circuits using a higher voltage than the input signal voltage used during normal operation of the internal circuit, there is provided a protection circuit where a P-type MOS transistor is connected across a node of a signal line connecting the input terminal and the internal circuit and a power supply voltage, and an N-type MOS transistor connected across the node and an earth voltage. With this semiconductor integrated circuit, a voltage determining circuit for determining whether a voltage for normal operation of the semiconductor integrated circuit or a high voltage (10V) for switching over to operating mode is inputted to the input terminal is connected between the node and the internal circuit. In this kind of protection circuit, the gate electrode of the P-type MOS transistor is connected to the substrate and a pad for high voltage use, and the gate electrode of an N-type MOS transistor is connected to the substrate voltage and an earth voltage.

With semiconductor integrated circuits equipped with this kind of protection circuit, when a voltage applied to the input terminal is an abnormal voltage higher than a voltage (for example, 10V) for switching the operating mode over to internal circuit testing, this high voltage is drawn from a high-voltage pad via a P-type transistor. On the other hand, when the voltage applied to the input terminal is an abnormal voltage (low voltage) lower than an earth voltage (for example, 0V,), this low voltage is drawn from the earth voltage via an N-type MOS transistor. As a result, application of an abnormal voltage (high voltage or low voltage) to the internal circuit and damage to the internal circuit is prevented.

However, with related semiconductor integrated circuits equipped with a protection circuit, a high voltage (for example, 10V) pad connected to the gate electrode and substrate of the P-type MOS transistor has to be provided in order to protect the internal circuit from abnormal voltages (high voltages in excess of 10V). However, when this high-voltage pad is provided, it is also necessary to provide a protection transistor to protect the high voltage pad itself and this increases the surface area of the semiconductor chip. On the other hand, when the gate electrode and substrate potential of the P-type MOS transistor are connected to the power supply voltage (for example, 5V) used during normal operation of the internal circuit in order to prevent increases in the semiconductor chip surface area, this voltage is drawn from the power supply voltage side via the P-type MOS transistor when a high voltage (for example, 10V) is inputted when switching over to internal circuit testing mode and switching over to internal circuit testing mode therefore becomes difficult.

In the related technology described above, the withstand voltage of a transistor having a protection function falls with increasing speed in the operation of elements of the semiconductor integrated circuit. N-type MOS transistors (earth voltage side protection transistors), where the potential difference between values (for example, 0V to 10V) of input signal voltages used during normal operation of the internal circuit and used during switching over to internal circuit test mode is large, can therefore become damaged as the withstand voltage of the transistor becomes lower. As a result, the value of the input signal voltage used during switching to internal circuit test mode may fall and setting of the desired operating mode may become difficult.

SUMMARY OF THE INVENTION

The object of the present invention is to provide a semiconductor integrated circuit which has a superior protection function whilst remaining small.

In order to achieve the aforementioned object, the semiconductor integrated circuit of the present invention comprises an internal circuit supplied with a power supply voltage, an input terminal connected to the internal circuit by a signal line, a first P-type MOS transistor having a gate electrode, first electrode and substrate connected to the power supply voltage, and a second electrode, and a second P-type MOS transistor having a third electrode connected to the second electrode of the first P-type MOS transistor and a fourth electrode, substrate and gate electrode connected to the signal line.

In order to achieve the aforementioned object, a further semiconductor integrated circuit of the present invention comprises an internal circuit supplied with a power supply voltage, an input terminal connected to the internal circuit by a signal line, a first N-type MOS transistor having a first electrode connected to the power supply voltage, a second electrode connected to the signal line, and a gate electrode and substrate connected to the earth voltage; and a second N-type MOS transistor having a third electrode connected to the signal line via a resistor, and a fourth electrode, gate electrode and substrate connected to the earth voltage.

In order to achieve the aforementioned object, a still further semiconductor integrated circuit of the present invention comprises an internal circuit supplied with a power supply voltage, an input terminal connected to the internal circuit by a signal line, a first N-type MOS transistor having a first electrode connected to the power supply voltage, a second electrode connected to the signal line, and a gate electrode and substrate connected to the earth voltage, a second N-type MOS transistor having a third electrode connected to the signal line, a fourth electrode, a gate electrode connected to the earth voltage, and a substrate connected to the fourth electrode, and a third N-type MOS transistor having a fifth electrode connected to the fourth electrode, and a sixth electrode, gate electrode and substrate connected to the earth voltage.

DETAILED DESCRIPTION OF THE INVENTION

The following is a description, with reference to the drawings, of the embodiments of the present invention.

Figure 1:
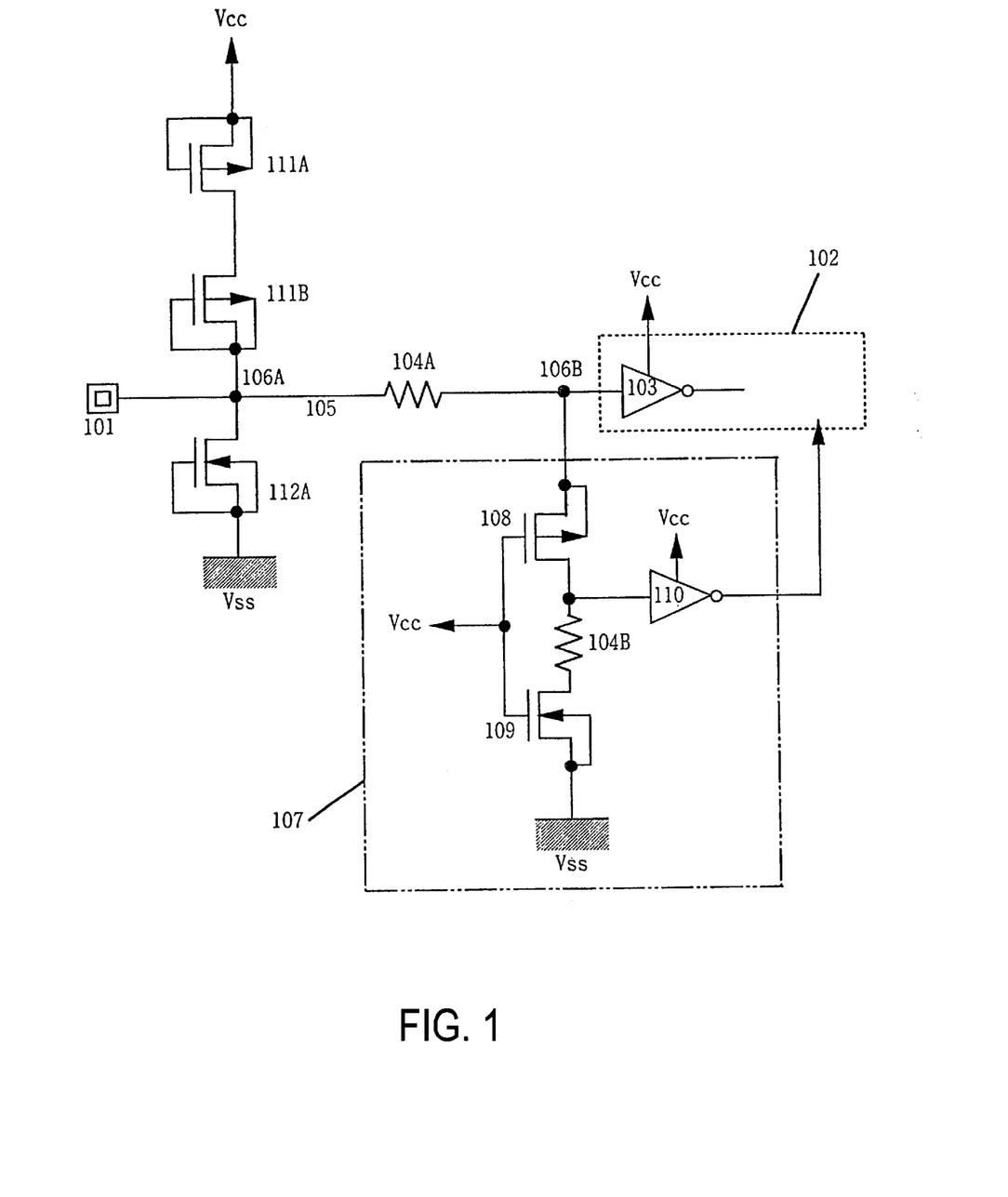
FIG. 1 is a view of a semiconductor integrated circuit of a first embodiment of the present invention.

FIG. 1 is a view of a semiconductor integrated circuit of a first embodiment of the present invention.

In the first embodiment, at an input terminal 101, a voltage of, for example, 5V for the normal operation of an internal circuit 102 and a signal voltage of, for example 10V for testing the internal circuit are inputted.

The internal circuit 102 includes an inverter 103 inputted with the input signal and is supplied with a 5V power supply voltage Vcc. The input terminal 101 and the internal circuit 102 are connected by a signal line 105 having a resistor 104A. A voltage determining circuit 107 for determining whether a voltage of an input signal inputted to the input terminal 101 is a signal voltage for use in the normal operation of the internal circuit 102 or a signal voltage for use during testing of the internal circuit is connected to the node 106B of the signal line 105. This voltage determining circuit 107 comprises a P-type MOS transistor 106, an N-type MOS transistor 107, a resistor 104B and an inverter 108. A gate electrode of the P-type MOS transistor 106 is connected to the power supply voltage Vcc, a substrate is connected to the source (or node 106B of the signal line 105) and a drain is connected to the resistor 104B. A gate electrode of a P-type MOS transistor 109 is connected to the power supply voltage Vcc, a substrate is connected to the drain (or an earth voltage Vss) and a source is connected to the resistor 104B. An inverter 110 supplied with the power supply voltage Vcc is connected to a drain of a P-MOS transistor 108. With the voltage determining circuit 107, when the P-type MOS transistor 108 is not conducting, the drain potential of the P-type MOS transistor 108 is decided by the resistance value of the resistor 104 and the N-type MOS transistor 109. This voltage is then transmitted to the internal circuit 102 as a signal for setting the internal circuit 102 into normal operating mode, via the inverter 110. On the other hand, when the P-type MOS transistor 108 is conducting, the drain potential of the P-type MOS transistor 108 rises due to the input signal voltage, so that when this voltage value exceeds the threshold value for starting an operation for switching over the output level of the inverter 110, this voltage value is transmitted to the internal circuit 102 as a signal for setting the internal circuit 102 to internal circuit test mode, via the inverter 110. With this kind of voltage determining circuit 107, the value of the input signal voltage inputted at the input terminal 101 can be detected and the normal operating mode and test operating mode occurring at the internal circuit 102 can be switched over.

P-type MOS transistors 111A and 111B are connected in series across a node 106A of the signal line 105 and the power supply voltage Vcc. The peak inverse voltage of the P-type MOS transistor 111B is set so as to become the value (10V) of the voltage used at the time of switching over to internal circuit testing of the internal circuit 102. The source of the P-type MOS transistor 111A is connected to the power supply voltage Vcc together with the gate electrode and the substrate, and the drain is connected to the drain of the P-type MOS transistor 111B. The source of the P-type MOS transistor 111B is connected to the signal line together with the gate electrode and the substrate, and the drain is connected to the drain of the P-type MOS transistor 111A.

An N-type MOS transistor 112A is connected across the node 106A of the signal line 105 and the earth potential Vss, the source is connected to node 106A of the signal line 105, and the drain is connected to the earth voltage together with the gate electrode and the substrate. The peak inverse voltage of the N-type MOS transistor 112A is set to be the value (10V) of the voltage used at the time of switching over to internal circuit testing of the internal circuit 102.

Next, a description is given of the operation of the semiconductor integrated circuit of the first embodiment of the present invention.

First, a description is given of the case where a signal voltage (for example, 5V) for setting the internal circuit 102 to normal operating mode is inputted to the input terminal 101.

In this case, first, the input signal voltage is sensed by the voltage determining circuit 107 and the internal circuit 102 is switched over to normal operating mode. The peak inverse voltage of the P-type MOS transistor 111B is set so as to become a voltage value (here, 10V) higher than the input signal voltage during normal operation of the internal circuit 102, and the P-type MOS transistor 111A with a gate electrode and substrate connected to the power supply voltage Vcc is provided across the P-type MOS transistor 111B and the power supply voltage Vcc. The P-type MOS transistor 111B therefore does not enter a conducting state due to the 5V input signal voltage. The input signal voltage used during normal operation of the internal circuit 102 is not drawn from the power supply voltage Vcc. However, the level of the input signal voltage does not rise because the P-type MOS transistor 111A with a gate electrode and substrate connected to the power supply voltage Vcc and is connected across the P-type MOS transistor 111B and the power supply voltage Vcc.

On the other hand, the peak inverse voltage of the N-type MOS transistor 112A is also set to a voltage of a value higher than the input signal voltage during normal operation and the gate electrode and substrate of the N-type MOS transistor 112A are connected to the earth voltage Vss. The aforementioned input signal voltage is therefor also not drawn from the earth voltage Vss.

As a result of the above, the input signal voltage (0V to 5V) used during normal operation of the internal circuit 102 is inputted to the inverter 103 of the internal circuit 102 without the level of this voltage fluctuating.

Next, a description is given of when an input signal voltage (for example, 0V) greater than the input signal voltage (for example, 5V) used during normal operation of the internal circuit 102 is inputted to the input terminal 101, i.e. a description is given of the case of carrying out a semiconductor integrated circuit internal circuit test.

In this case, the peak inverse voltage of the P-type MOS transistor 111B is set so as to be the same as the value (10V) of the input signal voltage during internal circuit testing of the internal circuit 102. Further, the P-type MOS transistor 111B does not enter into a conducting state due to the input signal voltage of 10V because the gate electrode and substrate of the P-type MOS transistor 111B are connected to the node 106A of the signal line 105. The input signal voltage used during switching to internal circuit testing is therefore not drawn from the power supply voltage Vcc.

On the other hand, the peak inverse voltage of the N-type MOS transistor 112A is also set so as to become the same as the value (10V) of the input signal voltage during switching to the internal circuit testing of the internal circuit and the gate electrode and base are connected to the earth voltage Vss. The N-type MOS transistor 112A is therefore not made to enter a conducting state by the input signal voltage of 10V. The input signal voltage used during switching to internal circuit testing is therefore not drawn from the earth voltage Vss.

As a result of the above, the input signal voltage (10V) used during switching to internal circuit testing is transmitted to the node 106B without fluctuations in this voltage level and the internal circuit testing mode is switched over to as a result of the inverter 110 of the voltage determining circuit 107 outputting "0V".

With the semiconductor integrated circuit of this embodiment, the peak inverse voltage of the P-type MOS transistor 111B is set so as to become the voltage value (10V) required during switching to internal circuit testing. It is therefore no longer necessary to provide the high voltage (10V) pad as provided in the aforementioned related art and increases in the surface area of the semiconductor chip itself can be suppressed.

Next, the case where an abnormal voltage (for example, a high voltage greater than 10V or a low voltage lower than 0V) other than the input signal voltages inputted when the internal circuit 102 is in normal operating mode or is switching over to internal circuit testing is inputted to the input terminal 101 will be described.

When a high voltage (for example, a voltage greater than 10V) is inputted to the input terminal 101, the voltage applied to the P-type MOS transistor 111B exceeds the peak inverse voltage (in the case of this embodiment, 10V) and at the P-type MOS transistor 111A the drain (P-type) becomes a higher potential than the source (N-type), i.e. the P-type MOS transistors 111A and 111B both enter conducting states and the high voltage (abnormal voltage) inputted to the input terminal 101 is drawn from the power supply voltage Vcc via the P-type MOS transistors 111A and 111B.

On the other hand, when a low voltage (for example, a voltage lower than 0V) is inputted to the input terminal 101, at the N-type MOS transistor 112A, the source (N-type) of the N-type MOS transistor 112A becomes a lower potential than the drain (P-type), i.e. the N-type MOS transistor 112A enters a conducting state and the low voltage (abnormal voltage) inputted to the input terminal 101 is drawn from the earth voltage Vss via the N-type MOS transistor 112A.

As a result, the internal circuit 102 of the semiconductor integrated circuit is prevented from being damaged by the abnormal voltage.

According to the first embodiment, the input terminal 101 used in normal operation of the internal circuit 102 of the semiconductor integrated circuit can also be used for inputting the high voltage input signal during testing of the internal circuit 102 and a semiconductor integrated circuit which is small while providing a superior protection function can be provided.

Figure 2:
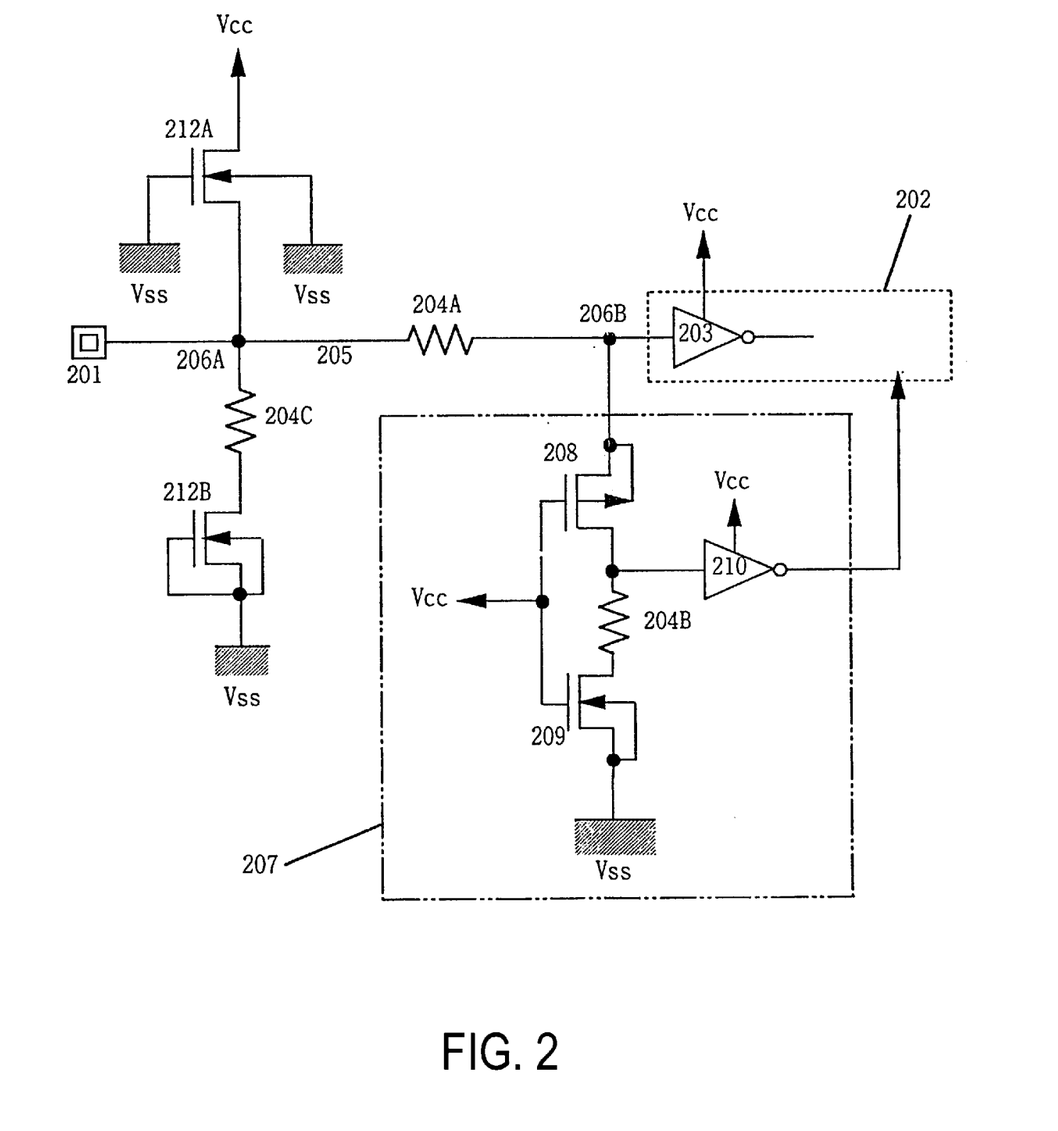
FIG. 2 is a view of a semiconductor integrated circuit of a second embodiment of the present invention.

FIG. 2 is a view of a semiconductor integrated circuit of a second embodiment of the present invention.

In the second embodiment, at an input terminal 201, as with the case of the first embodiment, a voltage of, for example, 5V for the normal operation of an internal circuit 202 and a signal voltage of, for example 10V for internal circuit testing are inputted.

The internal circuit 202 includes an inverter 203 inputted with the input signal and is supplied with a 5V power supply voltage Vcc. The input terminal 201 and the internal circuit 202 are connected by a signal line 205 having a resistor 204A. A voltage determining circuit 207 for determining whether a voltage of an input signal inputted to the input terminal 201 is a signal voltage for use in the normal operation of the internal circuit 202 or a signal voltage for use during switching to internal circuit test mode is connected to the node 206A of the signal line 205. This voltage determining circuit 207 comprises a P-type MOS transistor 206, an N-type MOS transistor 207, a resistor 204B and an inverter 208. A gate electrode of the P-type MOS transistor 206 is connected to the power supply voltage Vcc, a substrate is connected to the source (or node 206B of the signal line 205) and a drain is connected to the resistor 204B. A gate electrode of a P-type MOS transistor 209 is connected to the power supply voltage Vcc, a substrate is connected to the drain (or an earth voltage Vss) and a source is connected to the resistor 204B. An inverter 210 supplied with the power supply voltage Vcc is connected to a drain of a P-MOS transistor 208. With the voltage determining circuit 207, when the P-type MOS transistor 208 is not conducting, the drain potential of the P-type MOS transistor 208 is decided by the resistance value of the resistor 104 and the N-type MOS transistor 209. This voltage is then transmitted to the internal circuit 202 as a signal for setting the internal circuit 202 into normal operating mode, via the inverter 210. On the other hand, when the P-type MOS transistor 108 is conducting, the drain potential of the P-type MOS transistor 108 rises due to the input signal voltage, so that when this voltage value exceeds the threshold value for starting an operation for switching over the output level of the inverter 110, this voltage value is transmitted to the internal circuit 102 as a signal for setting the internal circuit 102 to internal circuit test mode, via the inverter 110. With this kind of voltage determining circuit 207, the value of the input signal voltage inputted at the input terminal 201 can be detected and the normal operating mode and test operating mode occurring at the internal circuit 202 can be switched over.

An N-type MOS transistor 212A is connected in series across a node 206A of the signal line 105 and the power supply voltage Vcc. The gate electrode and substrate of the N-type MOS transistor 212A are connected to the earth voltage Vss. A resistor 204C and an N-type MOS transistor 212B are connected in series across the signal line 205 and the earth voltage Vss. The gate electrode and substrate of the N-type MOS transistor 212B are connected to the earth voltage Vss. The peak inverse voltages of the N-type MOS transistors 212A and 212B are both set to 10V.

Next, a description is given of the operation of the semiconductor integrated circuit of the second embodiment of the present invention.

First, a description is given of the case where a signal voltage (for example, 5V) for setting the internal circuit 202 to normal operating mode is inputted to the input terminal 201.

In this case, first, the input signal voltage is sensed by the voltage determining circuit 207 and the internal circuit 202 is switched over to normal operating mode. The N-type MOS transistors 212A and 212B do not enter conducting states due to the 5V input signal voltage because the peak inverse voltages of the N-type MOS transistors 212A and 212B are set to be voltage values (in this case, 10V) higher than the input signal voltages during normal operation of the internal circuit 202 and because the substrates of the N-type MOS transistors 212A and 212B are connected to the earth voltage Vss. However, the input signal voltage used during normal operation of the internal circuit 202 is inputted to the inverter 203 of the internal circuit 202 without being drawn from the power supply voltage Vcc. Rising or falling of the input voltage level occurring at the input terminal 201 can therefore be prevented.

Next, a description is given of when an input signal voltage (for example, 10V) greater than the input signal voltage (for example, 5V) used during normal operation of the internal circuit 202 is inputted to the input terminal 201, i.e. a description is given of the case of carrying out a semiconductor integrated circuit internal circuit test.

In this case also, the N-type MOS transistors 212A and 212B do not enter into a conducting state due to the input signal voltage of 10V because the peak inverse voltages of the N-type MOS transistors 212A and 212B are set so as to be the same as the value (10V) of the input signal voltage during withstand voltage testing of the internal circuit 102 and the gate electrodes and substrates of the N-type MOS transistors 212A and 212B are connected to the earth voltage Vss, i.e. the input signal voltage used in internal circuit testing can be transmitted to the node 206B without being drawn from the earth voltage Vss and switching over to internal circuit testing mode is performed as a result of an inverter 210 of the voltage determining circuit 207 outputting "0V".

At this time there is a potential difference of 10V across the node 206A of the signal line 205 and the earth voltage Vss but this voltage is divided between the resistor 204C and the N-type MOS transistor 212B. As a result, the voltage across the source and drain of the N-type MOS transistor 212B is kept lower than in the related art and damage to the N-type MOS transistor 212B can be prevented.

With the semiconductor integrated circuit of this embodiment, the peak inverse voltage of the N-type MOS transistor 212A is set so as to become the voltage value (for example, 10V) required for testing the internal circuit 202. It is therefore no longer necessary to provide the high voltage (10V) pad as provided in the aforementioned related art and increases in the surface area of the semiconductor chip itself can be suppressed.

Next, the case where an abnormal voltage (for example, a high voltage greater than 10V or a low voltage lower than 0V) other than the input signal voltages inputted when the internal circuit 202 is set to normal operating mode or internal circuit testing mode is inputted to the input terminal 101 will be described.

When a high voltage (for example, a voltage greater than 10V) is inputted to the input terminal 201, the voltage applied to the N-type MOS transistors 212A and 212B (the respective potential differences across the node 206A of the signal line 205 and the earth voltage Vss when passing via the N-type MOS transistors 212A and 212B) exceeds the peak inverse voltages (in the case of this embodiment, 10V) of the N-type MOS transistors 212A and 212B, The high voltage (abnormal voltage) inputted to the input terminal 201 is therefore drawn from the earth voltage Vss via the N-type MOS transistors 212A and 212B.

On the other hand, when a low voltage (for example, a voltage lower than 0V) is inputted at the input terminal 201, the potential of the node 206A of the signal line 205 becomes lower than the earth voltage Vss. The low voltage (abnormal voltage) inputted at the input terminal 201 is therefore drawn from the earth voltage Vss via the N-type MOS transistors 212A and 212B.

According to the aforementioned second embodiment, the input terminal 201 used during normal operation of the internal circuit 202 can also be used for inputting a high voltage input signal during testing of the internal circuit 202, a protection transistor provided across the node 206A of the signal line 205 and the power supply voltage Vcc is taken to be the N-type MOS transistor 212A, and a resistor 204C and N-type MOS transistor 212B are connected in series across the node 206A of the signal line 205 and the earth voltage Vss. A semiconductor integrated circuit, equipped with a superior protection function, that is smaller than that of the first embodiment, can therefore be provided.

Figure 3:
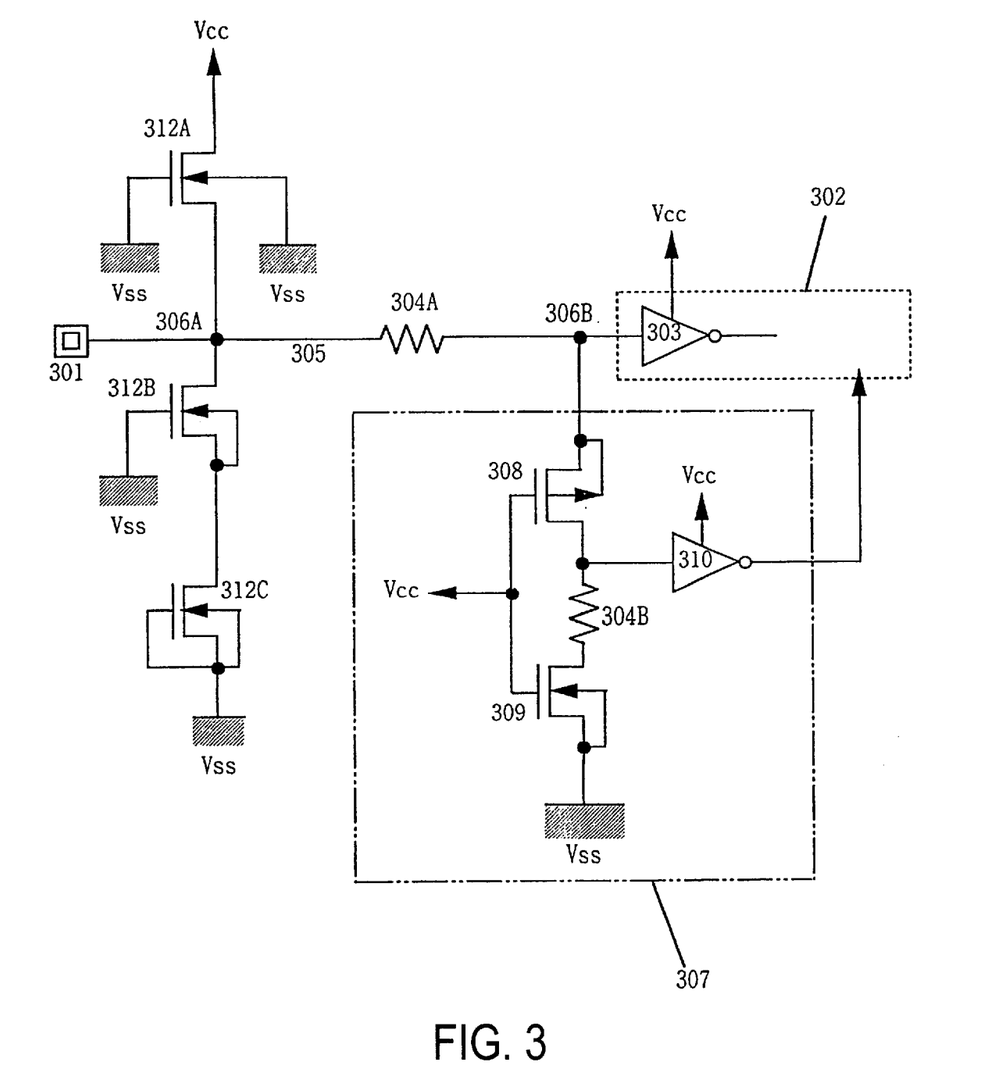
FIG. 3 is a view showing a semiconductor integrated circuit of a third embodiment of the present invention.

FIG. 3 is a view showing a semiconductor integrated circuit of a third embodiment of the present invention.

In the third embodiment, at an input terminal 301, as with the case of the first and second embodiments, a voltage of, for example, 5V for the normal operation of an internal circuit 302 and a signal voltage of, for example, 10V for internal circuit testing are inputted.

The internal circuit 302 includes an inverter 303 inputted with the input signal and is supplied with a 5V power supply voltage Vcc. The input terminal 301 and the internal circuit 302 are connected by a signal line 305 having a resistor 304A. A voltage determining circuit 307 for determining whether a voltage of an input signal inputted to the input terminal 301 is a signal voltage for use in the normal operation of the internal circuit 302 or a signal voltage for use during testing of the internal circuit 302 is connected to the node 306B of the signal line 305. This voltage determining circuit 307 comprises a P-type MOS transistor 308, an N-type MOS transistor 309, a resistor 304B and an inverter 310. A gate electrode of the P-type MOS transistor 308 is connected to the power supply voltage Vcc, a substrate is connected to the source (or node 306B of the signal line 305) and a drain is connected to the resistor 304B. A gate electrode of a P-type MOS transistor 309 is connected to the power supply voltage Vcc, a substrate is connected to the drain (or an earth voltage Vss) and a source is connected to the resistor 304B. An inverter 310 supplied with the power supply voltage Vcc is connected to a drain of a P-MOS transistor 308. With the voltage determining circuit 307, when the P-type MOS transistor 308 is not conducting, the drain potential of the P-type MOS transistor 308 is decided by the resistance value of the resistor 304B and the N-type MOS transistor 309. This voltage is then transmitted to the internal circuit 302 as a signal for setting the internal circuit 302 into normal operating mode, via the inverter 310. On the other hand, when the P-type MOS transistor 308 is conducting, the drain potential of the P-type MOS transistor 308 rises due to the input signal voltage, so that when this voltage value exceeds the threshold value for starting an operation for switching over the output level of the inverter 310, this voltage value is transmitted to the internal circuit 302 as a signal for setting the internal circuit 302 to internal circuit test mode, via the inverter 310. With this kind of voltage determining circuit 307, the value of the input signal voltage inputted at the input terminal 301 can be detected and the normal operating mode and test operating mode occurring at the internal circuit 302 can be switched over.

An N-type MOS transistor 312A is connected in series across a node 306A of the signal line 305 and the power supply voltage Vcc. The gate electrode and substrate of the N-type MOS transistor 312B are connected to the earth voltage Vss.

N-type MOS transistors 312B and 312C are connected in series across the signal line 305 and the earth voltage Vss. The gate electrode and substrate of the N-type MOS transistor 312C are connected to the earth voltage Vss, the gate electrode of the N-type MOS transistor 312B is connected to the earth voltage Vss, and the substrate is connected to the source of the N-type MOS transistor 312. Here, the peak inverse voltages of the N-type MOS transistors 312A, 312B and 312C are set to all be 10V.

Next, a description is given of the operation of the semiconductor integrated circuit of the third embodiment of the present invention.

First, a description is given of the case where a signal voltage (for example, 5V) for setting the internal circuit 302 to normal operating mode is inputted to the input terminal 301.

In this case, first, the input signal voltage is sensed by the voltage determining circuit 307 and the internal circuit 302 is switched over to normal operating mode. The N-type MOS transistor 312A does not enter a conducting state due to the 5V input signal voltage because the peak inverse voltage of the N-type MOS transistor 312A is set in such a manner as to become a voltage value (in this case, 10V) higher than the input signal voltage during normal operation of the internal circuit 302 and because the substrate of the N-type MOS transistors 312A is connected to the earth voltage Vss. However, the input signal voltage used during normal operation of the internal circuit 302 is not drawn from the power supply voltage Vcc.

On the other hand, the N-type MOS transistor 312B does not enter a conducting state due to the 5V input signal voltage because the substrate of the N-type MOS transistor 312B is connected to the source of the N-type MOS transistor 312C and the peak inverse voltage of the N-type MOS transistor 312B is set in such a manner as to become 10V. However, the input signal voltage used during normal operation of the internal circuit 302 is inputted to the inverter 303 of the internal circuit 302 without being drawn from the power supply voltage Vcc. Rising or falling of the input voltage level occurring at the input terminal 301 can therefore be prevented.

Next, a description is given of when an input signal voltage (for example, 10V) greater than the input signal voltage (for example, 5V) used during normal operation of the internal circuit 302 is inputted to the input terminal 301, i.e. a description is given of the case of carrying out a semiconductor integrated circuit internal circuit test.

In this case also, the N-type MOS transistor 312A does not enter into a conducting state due to the input signal voltage of 10V because the peak inverse voltage of the N-type MOS transistor 312A are set so as to be the same as the value (10V) of the input signal voltage during withstand voltage testing of the internal circuit 302 and the gate electrode and substrate of the N-type MOS transistor 312A is connected to the earth voltage Vss, i.e. the input signal voltage used in internal circuit testing can be transmitted to the node 306B without being drawn from the earth voltage Vss and switching over to internal circuit testing mode is performed as a result of an inverter 310 of the voltage determining circuit 307 outputting "0V".

On the other hand, the N-type MOS transistor 312B does not enter a conducting state due to the 10V input signal voltage because the peak inverse voltage of the N-type MOS transistor 312B is also set to become the same as the input signal voltage value (10V) during withstand voltage testing of the internal circuit 302, the gate electrode of the N-type MOS transistor 312B is connected to the earth voltage Vss and the substrate of the N-type MOS transistor 312B is connected to the source of the N-type MOS transistor 312C, i.e. the input signal voltage used in internal circuit testing can be transmitted to the node 306B without being drawn from the earth voltage Vss and switching over to internal circuit testing mode is performed as a result of an inverter 310 of the voltage determining circuit 307 outputting "0V".

At this time there is a potential difference of 10V across the node 306A of the signal line 305 and the earth voltage Vss but this voltage is divided between the N-type MOS transistors 312C and 312B. As a result, the voltage applied across the source and drain of one N-type MOS transistor can be kept lower than for the related art and damage to N-type MOS transistors 312B and 312C that are protection transistors can be prevented.

With the semiconductor integrated circuit of this embodiment, the peak inverse voltage of the N-type MOS transistor 312A is set so as to become the voltage value (for example, 10V) required for testing the internal circuit 302. It is therefore no longer necessary to provide the high voltage (10V) pad as provided in the aforementioned related art and increases in the surface area of the semiconductor chip itself can be suppressed.

Next, the case where an abnormal voltage (for example, a high voltage greater than 10V or a low voltage lower than 0V) other than the input signal voltages inputted when the internal circuit 302 is set to normal operating mode or internal circuit testing mode is inputted to the input terminal 301 will be described.

When a high voltage (for example, a voltage greater than 10V) is inputted to the input terminal 301, the voltage applied to the N-type MOS transistor 312A (the potential difference across the node 306A of the signal line 305 and the earth voltage Vss when passing via the N-type MOS transistor 312A) exceeds the peak inverse voltage (in the case of this embodiment, 10V) of the N-type MOS transistor 312A, The high voltage (abnormal voltage) inputted to the input terminal 301 is therefore drawn from the earth voltage Vss via the N-type MOS transistor 312A.

On the other hand, when a low voltage (for example, a voltage lower than 0V) is inputted at the input terminal 301, the potential of the node 306A of the signal line 305 becomes lower than the earth voltage Vss. The low voltage (abnormal voltage) inputted at the input terminal 301 is therefore drawn from the earth voltage Vss via the N-type MOS transistors 312B and 312C and the N-type MOS transistor 312A.

According to the aforementioned third embodiment, the input terminal 301 used during normal operation of the internal circuit 302 can also be used for inputting a high voltage input signal during testing of the internal circuit 302, a protection transistor provided across the node 306A of the signal line 305 and the power supply voltage Vcc is taken to be the N-type MOS transistor 312A, and the N-type MOS transistors 312B and 312C are connected in series across the node 306A of the signal line 305 and the earth voltage Vss. A semiconductor integrated circuit, equipped with a superior protection function, that is smaller than that of the first embodiment, can therefore be provided. Further, the voltage dividing ratio relating to the N-type MOS transistors 312B and 312C can easily be set using the same transistors as for the N-type MOS transistors 312B and 312C.

What is claimed is:

1. A semiconductor integrated circuit which receives an input signal and a test signal, the input signal having a first potential level and a second potential level which is lower than the first potential level, and the test signal having a third potential level which is higher than the first potential level, the semiconductor integrated circuit comprising:

an input terminal receiving the input signal and the test signal;

a first potential source supplying the first potential level;

a second potential source supplying the second potential level;

a first PMOS transistor coupled between said input terminal and said first potential source, wherein said first PMOS transistor turns on when said input terminal is at a first voltage which is higher than the third potential level;

a first NMOS transistor coupled between said input terminal and said second potential source, wherein said first NMOS transistor turns on when said input terminal is at a second voltage which is lower than the second potential level;

an internal circuit coupled to said input terminal, said internal circuit operating in response to the input signal and being in a test mode in response to a test mode signal; and a voltage determining circuit coupled to said input terminal and said internal circuit, said voltage determining circuit outputting the test mode signal in response to the test signal.

2. A semiconductor integrated circuit according to claim 1, further comprising a resistive element connected between said input terminal and said internal circuit.

3. A semiconductor integrated circuit according to claim 1, wherein said voltage determining circuit outputs no signal in response to the input signal.

4. A semiconductor integrated circuit according to claim 1, wherein said voltage determining circuit includes, a second PMOS transistor having a source and a substrate coupled to said input terminal, a gate coupled to said first potential source and a drain, a second NMOS transistor having a source and a substrate coupled to said second potential source, a gate coupled to said first potential source and a drain, a resistive element having a first terminal coupled to the drain of the second NMOS transistor and a second terminal, and an inverter having an input commonly coupled to the drain of the second PMOS transistor and the second terminal of the resistive element, and an output for outputting the test mode signal.

5. A semiconductor integrated circuit according to claim 1, wherein said internal circuit includes an inverter having an input coupled to said input terminal.

6. A semiconductor integrated circuit according to claim 1, wherein said first PMOS transistor includes a gate, a drain and a substrate all of which are commonly coupled to said input terminal, and a source.

7. A semiconductor integrated circuit according to claim 6, further comprising a third PMOS transistor including a drain coupled to the source of the first PMOS transistor, and a gate, a source and a substrate all of which are commonly coupled to said first potential source.

8. A semiconductor integrated circuit according to claim 1, wherein said first NMOS transistor includes, a gate, a source and a substrate all of which are commonly coupled to said second potential source and a source coupled to said input terminal.

9. A semiconductor integrated circuit which receives an input signal and a test signal, the input signal having a first potential level and a second potential level which is lower than the first potential level, and the test signal having a third potential level which is higher than the first potential level, the semiconductor integrated circuit comprising:

an input terminal receiving the input signal and the test signal;

a first potential source supplying the first potential level;

a second potential source supplying the second potential level;

a high voltage protection circuit coupled between said input terminal and said first potential source, wherein said high voltage protection circuit decreases an electric voltage that appears on said input terminal when said input terminal receives a high voltage signal having a first voltage which is higher than the third potential level;

a low voltage protection circuit coupled between said input terminal and said second potential source, wherein said low voltage protection circuit increases an electric voltage that appears on said input terminal when said input terminal receives a low voltage signal having a second voltage which is lower than the second potential level;

an internal circuit coupled to said input terminal, said internal circuit operating in response to the input signal and being in a test mode in response to a test mode signal; and a voltage determining circuit coupled to said input terminal and said internal circuit, said voltage determining circuit outputting the test mode signal in response to the test signal.

10. A semiconductor integrated circuit according to claim 9, further comprising a resistive element connected between said input terminal and said internal circuit.

11. A semiconductor integrated circuit according to claim 9, wherein said voltage determining circuit outputs no signal in response to the input signal.

12. A semiconductor integrated circuit according to claim 9, wherein said voltage determining circuit includes, a first PMOS transistor having a source and a substrate coupled to said input terminal, a gate coupled to said first potential source and a drain, a first NMOS transistor having a source and a substrate coupled to said second potential source, a gate coupled to said first potential source and a drain, a resistive element having a first terminal coupled to the drain of the first NMOS transistor and a second terminal, and an inverter having an input commonly coupled to the drain of the first PMOS transistor and the second terminal of the resistive element, and an output for outputting the test mode signal.

13. A semiconductor integrated circuit according to claim 9, wherein said internal circuit includes an inverter having an input coupled to said input terminal.

14. A semiconductor integrated circuit according to claim 9, wherein said high voltage protection circuit further includes a second PMOS transistor including a gate, a drain and a substrate all of which are commonly coupled to said input terminal, and a source.

15. A semiconductor integrated circuit according to claim 14, wherein said high voltage protection circuit further includes a third PMOS transistor including a drain coupled to the source of the first PMOS transistor, and a gate, a source and a substrate all of which are commonly coupled to said first potential source.

16. A semiconductor integrated circuit according to claim 9, wherein said high voltage protection circuit includes a second NMOS transistor including a source coupled to said first potential source, a drain coupled to said input terminal and a gate and a substrate both of which are commonly coupled to said second potential source.

17. A semiconductor integrate circuit according to claim 16, wherein said low voltage protection circuit includes a third NMOS transistor including a gate, a source and a substrate all of which are commonly coupled to said second potential source, and a source coupled to said input terminal.

18. A semiconductor integrated circuit according to claim 9, wherein said low voltage protection circuit includes a resistive element having a first terminal coupled to said input terminal and a second terminal, and a fourth NMOS transistor including a gate, a source and a substrate all of which are commonly coupled to said second potential source, and a source coupled to the second terminal of the resistive element.

19. A semiconductor integrated circuit according to claim 18, wherein the resistive element is a fifth NMOS transistor including a drain coupled to said input terminal, a gate coupled to said second potential source, and a drain and a substrate both of which are commonly coupled to the drain of the fourth NMOS transistor.

* * * * *